(12) United States Patent
Matsuda et al.

(10) Patent No.: US 8,957,451 B2
(45) Date of Patent: Feb. 17, 2015

(54) ENCAPSULATING SHEET, OPTICAL SEMICONDUCTOR DEVICE, AND PRODUCING METHOD THEREOF

(71) Applicant: Nitto Denko Corporation, Ibaraki-shi, Osaka (JP)

(72) Inventors: Hirokazu Matsuda, Osaka (JP); Haruka Ona, Osaka (JP); Yasunari Ooyabu, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 14/079,789

(22) Filed: Nov. 14, 2013

(65) Prior Publication Data
US 2014/0145230 A1    May 29, 2014

(30) Foreign Application Priority Data

Nov. 28, 2012   (JP) ................................. 2012-260119

(51) Int. Cl.
| | |
|---|---|
| *H01L 33/00* | (2010.01) |
| *H01L 33/56* | (2010.01) |
| *H01L 33/50* | (2010.01) |
| *H01L 33/52* | (2010.01) |
| *C08L 83/06* | (2006.01) |
| *C09D 183/14* | (2006.01) |
| *H01L 33/62* | (2010.01) |
| *C08G 77/12* | (2006.01) |
| *C08G 77/16* | (2006.01) |
| *C08G 77/20* | (2006.01) |

(52) U.S. Cl.
CPC .............. *H01L 33/56* (2013.01); *H01L 33/50* (2013.01); *H01L 33/52* (2013.01); *H01L 2933/005* (2013.01); *C08L 83/06* (2013.01); *H01L 33/62* (2013.01); *C09D 183/14* (2013.01); *C08G 77/12* (2013.01); *C08G 77/16* (2013.01); *C08G 77/20* (2013.01)
USPC .................. 257/99; 257/100; 438/26; 438/38

(58) Field of Classification Search
CPC .......... H01L 33/62; H01L 33/56; H01L 33/52
USPC ................................ 257/99, 100; 438/26, 38
See application file for complete search history.

(56) References Cited

U.S. PATENT DOCUMENTS

| | | | | |
|---|---|---|---|---|
| 7,928,457 | B2 * | 4/2011 | Kato et al. ....................... | 257/98 |
| 8,222,116 | B2 * | 7/2012 | Jinbo et al. ...................... | 438/458 |
| 8,263,421 | B2 * | 9/2012 | Yamazaki et al. ............... | 438/25 |
| 2009/0114922 | A1 * | 5/2009 | Shiroguchi et al. ............. | 257/72 |
| 2012/0028388 | A1 | 2/2012 | Katayama | |

FOREIGN PATENT DOCUMENTS

JP         2012-049508 A     3/2012

OTHER PUBLICATIONS

Communication dated May 14, 2014 from the European Patent Office in counterpart European Patent Application No. 13194813.5.

* cited by examiner

*Primary Examiner* — Ngan Ngo
(74) *Attorney, Agent, or Firm* — Sughrue Mion, PLLC

(57) ABSTRACT

An encapsulating sheet, for encapsulating an optical semiconductor element mounted on a board by a wire-bonding connection, includes an embedding layer for embedding the optical semiconductor element and a wire and a cover layer covering the embedding layer. The embedding layer and the cover layer contain a catalyst containing a transition metal and are prepared from a silicone resin composition that is cured by accelerating a reaction by the catalyst. The ratio of the concentration of the transition metal in the cover layer to that of the transition metal in the embedding layer is 1 or more. The length from an interface between the embedding layer and the cover layer to a portion of the wire that is positioned closest to the cover layer-side is 150 μm or more.

7 Claims, 2 Drawing Sheets

1

FIG. 2
FIG. 2 (a)
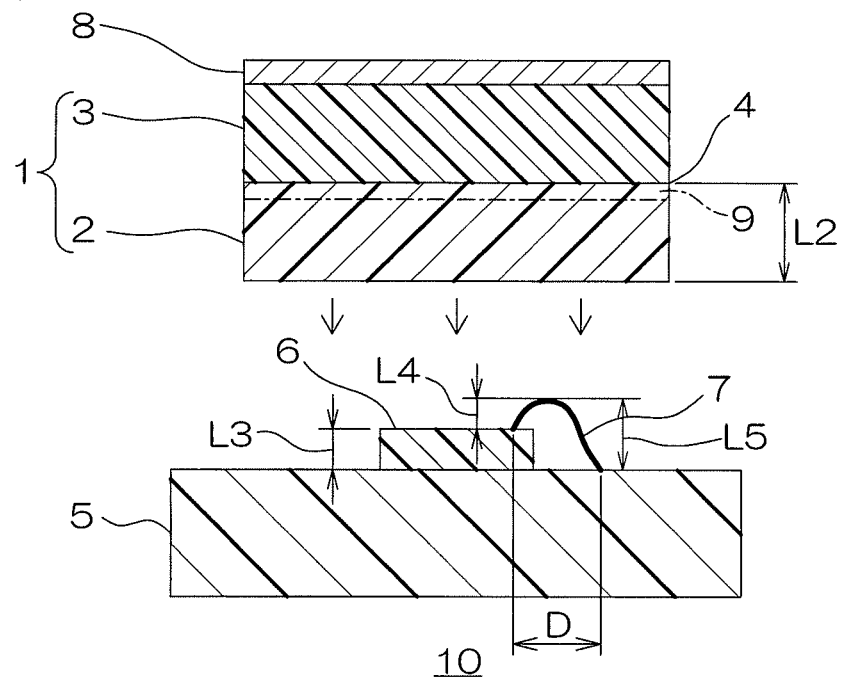
FIG. 2 (b)
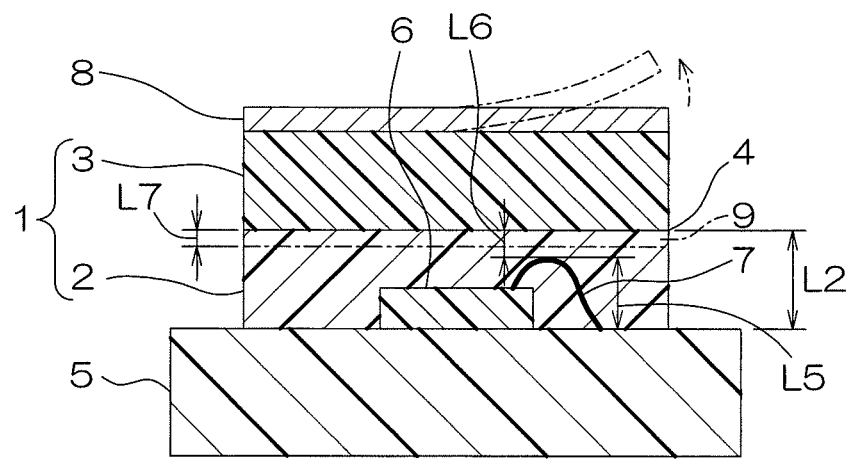

ENCAPSULATING SHEET, OPTICAL SEMICONDUCTOR DEVICE, AND PRODUCING METHOD THEREOF

CROSS-REFERENCE TO RELATED APPLICATION

The present application claims priority from Japanese Patent Application No. 2012-260119 filed on Nov. 28, 2012, the contents of which are hereby incorporated by reference into this application.

BACKGROUND OF THE INVENTION

1. Field of the Invention

The present invention relates to an encapsulating sheet, an optical semiconductor device, and a producing method thereof, to be specific, to an encapsulating sheet, an optical semiconductor device including the encapsulating sheet, and a producing method thereof.

2. Description of Related Art

An optical semiconductor device is produced by encapsulating an optical semiconductor element such as an LED (a light emitting diode element) that is mounted on a board by an encapsulating layer and a phosphor layer that contain a silicone resin. By the encapsulating layer and the phosphor layer that contain the silicone resin, the durability of the optical semiconductor element is improved and in this way, the long-term reliability of the optical semiconductor device is improved.

To be specific, as a method for obtaining an optical semiconductor device, the following method has been proposed (ref: for example, Japanese Unexamined Patent Publication No. 2012-49508). That is, first, a blue LED is mounted on a board by wire-bonding; next, the blue LED and a wire that connects the blue LED to the board is covered with (is embedded by) an encapsulating material that is prepared from a silicone resin; and subsequently, the encapsulating material is cured, so that an encapsulating layer is formed. Separately, a silicone resin composition containing a platinum-carbonyl complex (a hydrosilylation catalyst) is prepared to be applied to the surface of a release substrate and a precursor layer is formed. The obtained precursor layer is heated, so that a phosphor layer that is prepared from a silicone resin composition in a B-stage state is formed. Thereafter, the phosphor layer is transferred onto the encapsulating layer that covers the blue LED and next, the phosphor layer is heated, so that the silicone resin composition of the phosphor layer is completely cured.

SUMMARY OF THE INVENTION

However, in the method in Japanese Unexamined Patent Publication No. 2012-49508, first, the blue LED and the wire are covered with the encapsulating layer and next, after the phosphor layer is separately laminated on the surface of the release substrate, the phosphor layer is laminated on the encapsulating layer. Therefore, there is a disadvantage that the number of steps is large and thus, it requires much labor.

In order to solve such a disadvantage, it has been tentatively proposed that a laminate sheet in which the phosphor layer and the encapsulating layer are laminated in advance is used. In such a case, desirably, the phosphor layer is prepared in a C-stage state in order to obtain the handling ability of the encapsulating sheet, while the encapsulating layer is prepared in a B-stage state in order to embed the blue LED and the wire. In order to produce the laminate sheet with excellent production efficiency, it required that the amount of catalyst of the encapsulating layer is relatively reduced and the amount of catalyst of the phosphor layer is relatively increased. When the catalyst is blended in the phosphor layer and the encapsulating layer at such a proportion, however, there may be a case where a part of the catalyst that is contained much in the phosphor layer is transferred to the encapsulating layer in a B-stage state, so that the encapsulating layer is easily brought into a C-stage state. Accordingly, there is a disadvantage that when the blue LED and the wire are embedded by the encapsulating layer in a C-stage state, the wire has a relatively low mechanical strength, so that it is damaged.

It is an object of the present invention to provide an encapsulating sheet that is capable of easily embedding an optical semiconductor element with less number of steps and is capable of effectively preventing a damage to a wire, an optical semiconductor device, and a producing method thereof.

An encapsulating sheet of the present invention, for encapsulating an optical semiconductor element mounted on a board by a wire-bonding connection, includes an embedding layer for embedding the optical semiconductor element and a wire and a cover layer covering the embedding layer, wherein the embedding layer and the cover layer contain a catalyst containing a transition metal and are prepared from a silicone resin composition that is cured by accelerating a reaction by the catalyst; the ratio of the concentration of the transition metal in the cover layer to that of the transition metal in the embedding layer is 1 or more; and the length from an interface between the embedding layer and the cover layer to a portion of the wire that is positioned closest to the cover layer-side is 150 μm or more.

When the optical semiconductor element is embedded by the encapsulating sheet, the length from the interface between the embedding layer and the cover layer to the portion of the wire that is positioned closest to the cover layer-side is ensured to be 150 μm or more. And, a reaction of the silicone resin composition is accelerated and the curing is progressed, so that a cured region is formed in a cover layer-side portion of the embedding layer by the transition of the catalyst from the cover layer to the embedding layer caused by the ratio of the concentration of the transition metal in the cover layer to that of the transition metal in the embedding layer of 1 or more. Even so, overlapping of the cured region in the embedding layer with the wire can be prevented and a damage to the wire caused by the overlapping of the cured region with the wire can be effectively prevented.

The encapsulating sheet includes the embedding layer and the cover layer in advance, so that the optical semiconductor element and the wire can be collectively embedded by and covered with the embedding layer and the cover layer. Thus, the optical semiconductor element and the wire can be easily embedded and encapsulated with less number of steps.

In the encapsulating sheet of the present invention, it is preferable that the cover layer is formed from a silicone resin composition after complete curing and the embedding layer is formed from a silicone resin composition before complete curing.

In the encapsulating sheet, the cover layer is formed from the silicone resin composition after complete curing, so that it has excellent handling ability. Also, a damage to the wire can be effectively prevented and the wire can be embedded and encapsulated by the embedding layer that is formed from the silicone resin composition before complete curing.

In the encapsulating sheet of the present invention, it is preferable that the catalyst is a hydrosilylation catalyst and the transition metal is platinum.

In the encapsulating sheet, the catalyst is the hydrosilylation catalyst, so that the curing caused by a hydrosilylation reaction of the silicone resin composition can be surely accelerated.

In the encapsulating sheet of the present invention, it is preferable that the silicone resin composition of the embedding layer and/or the cover layer contains a phosphor.

In the encapsulating sheet, the silicone resin composition of the embedding layer and/or the cover layer contains the phosphor, so that the wavelength of light emitted from the optical semiconductor element is converted by the embedding layer and/or the cover layer, so that the conversion efficiency of the light can be increased.

A method for producing an optical semiconductor device of the present invention includes the steps of preparing an optical semiconductor element mounted on a board by a wire-bonding connection and embedding the optical semiconductor element by an encapsulating sheet, wherein the encapsulating sheet includes an embedding layer for embedding the optical semiconductor element and a wire and a cover layer covering the embedding layer, and the embedding layer and the cover layer contain a catalyst containing a transition metal and are prepared from a silicone resin composition that is cured by accelerating a reaction by the catalyst; the ratio of the concentration of the transition metal in the cover layer to that of the transition metal in the embedding layer is 1 or more; and the length from an interface between the embedding layer and the cover layer to a portion of the wire that is positioned closest to the cover layer-side is 150 µm or more.

In the method for producing an optical semiconductor device, the optical semiconductor element and the wire are encapsulated by the above-described encapsulating sheet, so that the length from the interface between the embedding layer and the cover layer to the portion of the wire that is positioned closest to the cover layer-side is ensured to be 150 µm or more. And, a reaction of the silicone resin composition is accelerated and the curing is progressed, so that a cured region is formed in a cover layer-side portion of the embedding layer by the transition of the catalyst from the cover layer to the embedding layer caused by the ratio of the concentration of the transition metal in the cover layer to that of the transition metal in the embedding layer of 1 or more. Even so, overlapping of the cured region in the embedding layer with the wire can be prevented and a damage to the wire caused by the overlapping of the cured region with the wire can be effectively prevented.

The encapsulating sheet includes the embedding layer and the cover layer in advance, so that the optical semiconductor element and the wire can be collectively covered with the embedding layer and the cover layer. Thus, the optical semiconductor element and the wire can be easily embedded and encapsulated with less number of steps.

An optical semiconductor device of the present invention includes the steps of preparing an optical semiconductor element mounted on a board by a wire-bonding connection and embedding the optical semiconductor element by the above-described encapsulating sheet.

In the optical semiconductor device, the optical semiconductor element is embedded by the above-described encapsulating sheet, so that a damage to the wire is effectively prevented and thus, the optical semiconductor device has excellent reliability.

An optical semiconductor device of the present invention includes an optical semiconductor element mounted on a board by a wire-bonding connection and an encapsulating sheet that is an encapsulating sheet and encapsulates the optical semiconductor element, wherein the encapsulating sheet includes an embedding layer for embedding the optical semiconductor element and a wire and a cover layer covering the embedding layer, and the embedding layer and the cover layer contain a catalyst containing a transition metal and are prepared from a silicone resin composition that is cured by accelerating a reaction by the catalyst; the ratio of the concentration of the transition metal in the cover layer to that of the transition metal in the embedding layer is 1 or more; and the length from an interface between the embedding layer and the cover layer to a portion of the wire that is positioned closest to the cover layer-side is 150 µm or more.

In the optical semiconductor device, the optical semiconductor element is embedded by the above-described encapsulating sheet, so that a damage to the wire is effectively prevented and thus, the optical semiconductor device has excellent reliability.

An optical semiconductor device of the present invention is produced by a method for producing an optical semiconductor device including the steps of preparing an optical semiconductor element mounted on a board by a wire-bonding connection and embedding the optical semiconductor element by an encapsulating sheet, wherein the encapsulating sheet includes an embedding layer for embedding the optical semiconductor element and a wire and a cover layer covering the embedding layer, and the embedding layer and the cover layer contain a catalyst containing a transition metal and are prepared from a silicone resin composition that is cured by accelerating a reaction by the catalyst; the ratio of the concentration of the transition metal in the cover layer to that of the transition metal in the embedding layer is 1 or more; and the length from an interface between the embedding layer and the cover layer to a portion of the wire that is positioned closest to the cover layer-side is 150 µm or more.

The optical semiconductor device is produced by the above-described method for producing an optical semiconductor device, so that a damage to the wire is effectively prevented and thus, the optical semiconductor device has excellent reliability.

In the encapsulating sheet of the present invention and the method for producing an optical semiconductor device of the present invention, the optical semiconductor element and the wire can be easily embedded and encapsulated with less number of steps.

The optical semiconductor device of the present invention has excellent reliability.

BRIEF DESCRIPTION OF THE DRAWINGS

FIG. 2 shows process drawings for illustrating one embodiment of a method for producing an optical semiconductor device of the present invention:

FIG. 2 (a) illustrating a step of preparing an LED mounted on a board by a wire-bonding connection and FIG. 2 (b) illustrating a step of embedding the LED by an encapsulating sheet.

DETAILED DESCRIPTION OF THE INVENTION

Figure 1:
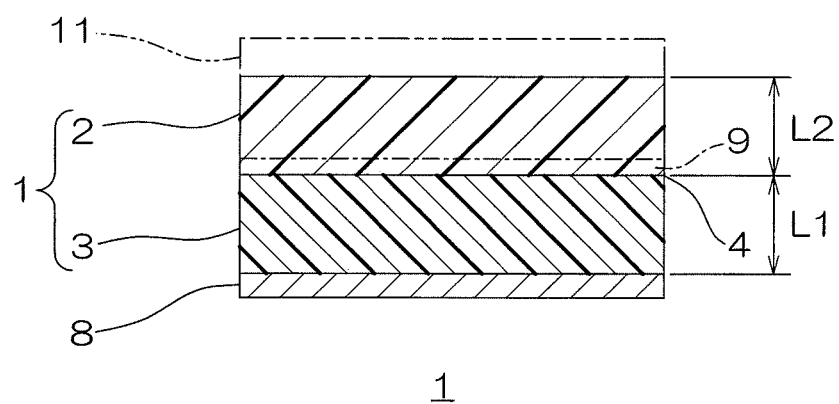
FIG. 1 shows a sectional view of one embodiment of an encapsulating sheet of the present invention.

In FIGS. 1 and 2, the up-down direction of the paper surface may be referred to as a first direction (a top-back direction); the right-left direction of the paper surface may be referred to as a second direction (a right-left direction); and the depth direction of the paper surface may be referred to as a third direction (a front-rear direction).

As shown in FIG. 1, an encapsulating sheet 1 is a sheet for encapsulating an LED 6 (ref: FIG. 2) that is to be mounted on a board 5 to be described later by a wire-bonding connection. The encapsulating sheet 1 includes an embedding layer 2 for embedding the LED 6 (ref: FIG. 2) and a wire 7 (ref: FIG. 2) to be described later and a cover layer 3 that covers the embedding layer 2. In the encapsulating sheet 1, a release sheet 8 that supports the cover layer 3 is provided.

In the encapsulating sheet 1, the cover layer 3 is formed from a silicone resin composition into a sheet shape.

The silicone resin composition contains at least a catalyst and to be specific, contains a catalyst and a silicone resin.

The catalyst is, for example, a curing catalyst that accelerates a reaction of the silicone resin and cures the silicone resin. Preferably, the catalyst is a hydrosilylation catalyst that accelerates a hydrosilylation reaction of the silicone resin to be described later and cures the silicone resin by hydrosilylation addition.

The catalyst contains a transition metal. An example of the transition metal includes a platinum metal such as platinum, palladium, and rhodium. Preferably, platinum is used.

To be specific, when the catalyst contains platinum, examples of the catalyst include inorganic platinum such as platinum black, platinum chloride, and chloroplatinic acid and a platinum complex such as a platinum-olefin complex, a platinum-carbonyl complex, and platinum-acetyl acetate. Preferably, a platinum complex is used. To be more specific, examples of the platinum complex include a platinum-vinylsiloxane complex, a platinum-tetramethyldivinyldisiloxane complex, a platinum-carbonylcyclovinylmethylsiloxane complex, a platinum-divinyltetramethyldisiloxane complex, a platinum-cyclovinylmethylsiloxane complex, and a platinum-octanal/octanol complex.

The catalyst has an embodiment in which the catalyst is blended separately from the silicone resin to be described next and an embodiment in which the catalyst is contained in the silicone resin as a component constituting the silicone resin.

The content ratio (the concentration) of the transition metal of the catalyst with respect to the silicone resin composition is, on the mass basis, 0.1 ppm or more, or preferably 0.3 ppm or more, and is, for example, 500 ppm or less, preferably 100 ppm or less, or more preferably 10 ppm or less.

The silicone resin is a curable silicone resin in which a reaction is accelerated by a catalyst to be cured. An example thereof includes a thermosetting silicone resin such as a two-step curable type silicone resin and a one-step curable type silicone resin.

The two-step curable type silicone resin is a thermosetting silicone resin that has a two-step reaction mechanism and in which a silicone resin is brought into a B-stage state (a semi-cured state) in the first step reaction and is brought into a C-stage state (a completely cured state) in the second step reaction.

The one-step curable type silicone resin is a thermosetting silicone resin that has a one-step reaction mechanism and in which a silicone resin is completely cured in the first step reaction.

The B-stage state is a state between an A-stage state in which a thermosetting silicone resin is soluble in a solvent and a C-stage state in which a thermosetting silicone resin is completely cured. Also, the B-stage state is a state in which the curing and the gelation are slightly progressed to be swollen but not to be completely dissolved in a solvent and also to be softened but not to be melted by heating.

As the thermosetting silicone resin, preferably, a one-step curable type silicone resin is used.

An example of the one-step curable type silicone resin of the cover layer 3 includes an addition reaction curable type polyorganopolysiloxane disclosed in Japanese Unexamined Patent Publication No. 2012-124428. To be specific, the addition reaction curable type polyorganopolysiloxane contains an ethylenically unsaturated hydrocarbon group-containing silicon compound and a hydrosilyl group-containing silicon compound.

As the ethylenically unsaturated hydrocarbon group-containing silicon compound, for example, a vinyl group-containing polyorganosiloxane that contains, in a molecule, two or more vinyl groups is used, or preferably, a polydimethylsiloxane containing vinyl groups at both ends is used. A commercially available product can be used as the ethylenically unsaturated hydrocarbon group-containing silicon compound. To be specific, an example of the commercially available product of the polydimethylsiloxane containing vinyl groups at both ends includes the DMS-V series such as DMS-V00, DMS-V03, DMS-V05, DMS-V21, DMS-V22, DMS-V25, DMS-V31, DMS-V33, DMS-V35, DMS-V41, DMS-V42, DMS-V46, and DMS-V52 (all are manufactured by Gelest, Inc.).

As the hydrosilyl group-containing silicon compound, for example, a hydrosilyl group-containing polyorganosiloxane that contains, in a molecule, two or more hydrosilyl groups is used, or preferably, a polydimethylsiloxane containing hydrosilyl groups at both ends and a methylhydrosiloxane-dimethylsiloxane copolymer blocked with trimethylsilyl groups at both ends are used. A commercially available product can be used as the hydrosilyl group-containing silicon compound. To be specific, an example of the commercially available product of the polydimethylsiloxane containing hydrosilyl groups at both ends includes the DMS-H series such as DMS-H03, DMS-H11, DMS-H21, DMS-H25, DMS-H31, and DMS-H41 (all are manufactured by Gelest, Inc.). To be specific, an example of the commercially available product of the methylhydrosiloxane-dimethylsiloxane copolymer blocked with trimethylsilyl groups at both ends includes the HMS series such as HMS-013, HMS-031, HMS-064, HMS-071, HMS-082, HMS-151, HMS-301, and HMS-501 (all are manufactured by Gelest, Inc.).

Furthermore, as the one-step curable type silicone resin, a commercially available product of a mixture of an ethylenically unsaturated hydrocarbon group-containing silicon compound, a hydrosilyl group-containing silicon compound, and a catalyst can be used. An example of the commercially available product thereof includes a silicone elastomer such as the ERASTOSIL series including ERASTOSIL LR7665 (manufactured by Wacker Asahikasei Silicone Co., Ltd.)

The mixing ratio of the silicone resin (a silicone component of the silicone resin, that is, when the silicone resin contains a catalyst, a component excluding the catalyst) with respect to the silicone resin composition is, for example, 30 mass % or more, or preferably 50 mass % or more, and is, for example, 99 mass % or less, or preferably 95 mass % or less.

The silicone resin composition can contain a filler.

The filler is blended in the silicone resin composition in order to improve the toughness of the cover layer 3. Examples of the filler include organic microparticles such as silicone particles (to be specific, including silicone rubber particles) and inorganic microparticles such as silica (for example, fumed silica), talc, alumina, nitride aluminum, and silicon nitride. The average value of the maximum length (in the case of the sphere shape, the average particle size) of the filler is, for example, 0.1 μm or more, or preferably 1 μm or more, and is, for example, 200 μm or less, or preferably 100 μm or less. The mixing ratio of the filler with respect to the silicone resin composition is, for example, 0.1 mass % or more, or preferably 0.5 mass % or more, and is, for example, 70 mass % or less, or preferably 50 mass % or less. The mixing ratio of the filler with respect to 100 parts by mass of the silicone resin is, for example, 0.1 parts by mass or more, or preferably 0.5 parts by mass or more, and is, for example, 70 parts by mass or less, or preferably 50 parts by mass or less.

The silicone resin composition can contain a phosphor as required.

The phosphor has a wavelength conversion function. Examples thereof include a yellow phosphor that is capable of converting blue light into yellow light and a red phosphor that is capable of converting blue light into red light.

Examples of the yellow phosphor include a silicate phosphor such as $(Ba,Sr,Ca)_2SiO_4$:Eu and $(Sr,Ba)_2SiO_4$:Eu (barium orthosilicate (BOS)); a garnet type phosphor having a garnet type crystal structure such as $Y_3Al_5O_{12}$:Ce (YAG (yttrium aluminum garnet):Ce) and $Tb_3Al_3O_{12}$:Ce (TAG (terbium aluminum garnet):Ce); and an oxynitride phosphor such as Ca-α-SiAlON.

An example of the red phosphor includes a nitride phosphor such as $CaAlSiN_3$:Eu and $CaSiN_2$:Eu.

Examples of a shape of the phosphor include a sphere shape, a plate shape, and a needle shape. Preferably, in view of fluidity, a sphere shape is used.

The average value of the maximum length (in the case of the sphere shape, the average particle size) of the phosphor is, for example, 0.1 μm or more, or preferably 1 μm or more, and is, for example, 200 μm or less, or preferably 100 μm or less.

The mixing ratio of the phosphor with respect to the silicone resin composition is, for example, 0.1 mass % or more, or preferably 0.5 mass % or more, and is, for example, 80 mass % or less, or preferably 50 mass % or less.

The cover layer 3 is, on the surface of the release sheet 8, formed from a silicone resin composition containing the above-described components (a silicone resin composition for a cover layer). Preferably, the cover layer 3 is formed from a silicone resin composition after complete curing in which a thermosetting silicone resin (to be specific, a one-step curable type silicone resin) is completely cured (is brought into a C-stage state).

A fabrication method of the cover layer 3 is described later in detail.

A concentration C1 of the transition metal in the cover layer 3 is, on the mass basis, for example, 0.1 ppm or more, preferably 0.2 ppm or more, or more preferably 0.25 ppm or more, and is, for example, 500 ppm or less, preferably 100 ppm or less, or more preferably 10 ppm or less. When the concentration C1 of the transition metal in the cover layer 3 is not less than the above-described lower limit, a reaction of the silicone resin is accelerated and the silicone resin can be cured within a desired duration (for example, 30 minutes or less), so that the productivity can be improved. On the other hand, when the concentration C1 of the transition metal in the cover layer 3 is not more than the above-described upper limit, shortening of a pot life of the silicone resin composition can be prevented.

The concentration C1 of the transition metal in the cover layer 3 is a concentration of the transition metal of the cover layer 3 before the transition metal to be described later is transferred to the embedding layer 2, to be specific, a concentration of the transition metal of the cover layer 3 immediately after the fabrication (within 24 hours since the fabrication). In other words, the concentration C1 of the transition metal in the cover layer 3 is substantially the same as the concentration C1 of the transition metal in the silicone resin composition (a silicone resin composition for a cover layer) for forming the cover layer 3. The concentration C1 of the transition metal in the silicone resin composition for a cover layer is measured by, for example, an ICP analysis. The concentration C1 is also obtained as a calculated value that is calculated from a charged amount of the components.

The cover layer 3 immediately after the fabrication has a compressive elastic modulus at 25° C. of, for example, 0.001 MPa or more, or preferably 0.01 MPa or more, and of, for example, 10 MPa or less, or preferably 5 MPa or less.

A thickness L1 of the cover layer 3, that is, a length L1 from the top surface of the cover layer 3 to the back surface thereof, that is, a length L1 from an interface 4 between the embedding layer 2 and the cover layer 3 to an interface between the cover layer 3 and the release sheet 8 is, for example, 50 μm or more, or preferably 100 μm or more, and is, for example, 2000 μm or less, preferably 1500 μm or less, or more preferably 1000 μm or less. When the thickness L1 of the cover layer 3 is not less than the above-described lower limit, a reduction in the handling ability of the encapsulating sheet 1 can be effectively prevented. When the thickness L1 of the cover layer 3 is not more than the above-described upper limit, an increase in the production cost of the encapsulating sheet 1 can be effectively suppressed.

The embedding layer 2 is positioned at the top-most surface of the encapsulating sheet 1. To be specific, the embedding layer 2 is, on the top surface of the cover layer 3, formed from a silicone resin composition into a sheet shape.

An example of the silicone resin composition of the embedding layer 2 includes the same silicone resin composition as that of the cover layer 3. In the silicone resin composition of the embedding layer 2, as the silicone resin, preferably, a two-step curable type silicone resin is used.

An example of the two-step curable type silicone resin includes a condensation reaction and addition reaction curable type silicone resin that has two reaction systems of a condensation reaction and an addition reaction.

The condensation reaction and addition reaction curable type silicone resin contains a catalyst. Examples of the condensation reaction and addition reaction curable type silicone resin include a first condensation reaction and addition reaction curable type silicone resin that contains a polysiloxane containing silanol groups at both ends, an alkenyl group-containing trialkoxysilane, an organohydrogenpolysiloxane, a condensation catalyst, and a hydrosilylation catalyst; a second condensation reaction and addition reaction curable type silicone resin that contains a polysiloxane containing silanol groups at both ends (ref: formula (1) to be described later), an ethylenically unsaturated hydrocarbon group-containing silicon compound (ref: formula (2) to be described later), an ethylenically unsaturated hydrocarbon group-containing silicon compound (ref: formula (3) to be described later), an organohydrogenpolysiloxane, a condensation catalyst, and a hydrosilylation catalyst; a third condensation reaction and addition reaction curable type silicone resin that contains a silicone oil containing silanol groups at both ends, an alkenyl group-containing dialkoxyalkylsilane, an organohydrogenpolysiloxane, a condensation catalyst, and a hydrosilylation catalyst; a fourth condensation reaction and addition reaction curable type silicone resin that contains an organopolysiloxane having, in one molecule, at least two alkenylsilyl groups, an organopolysiloxane having, in one molecule, at least two hydrosilyl groups, a hydrosilylation catalyst, and a curing retarder; a fifth condensation reaction and addition reaction curable type silicone resin that contains a first organopolysiloxane having, in one molecule, both at least two ethylenically unsaturated hydrocarbon groups and at least two hydrosilyl groups, a second organopolysiloxane having, in one molecule, at least two hydrosilyl groups without containing an ethylenically unsaturated hydrocarbon group, a hydrosilylation catalyst, and a hydrosilylation retarder; a sixth condensation reaction and addition reaction curable type silicone resin that contains a first organopolysiloxane having, in one molecule, both at least two ethylenically unsaturated hydrocarbon groups and at least two silanol groups, a second organopolysiloxane having, in one molecule, at least two hydrosilyl groups without containing an ethylenically unsaturated hydrocarbon group, a hydrosilylation retarder, and a hydrosilylation catalyst; a seventh condensation reaction and addition reaction curable type silicone resin that contains a silicon compound, and a boron compound or an aluminum compound; and an eighth condensation reaction and addition reaction curable type silicone resin that contains a polyaluminosiloxane and a silane coupling agent.

These condensation reaction and addition reaction curable type silicone resins can be used alone or in combination of two or more.

As the condensation reaction and addition reaction curable type silicone resin, preferably, a second condensation reaction and addition reaction curable type silicone resin is used. To be specific, the second condensation reaction and addition reaction curable type silicone resin is described in Japanese Unexamined Patent Publication No. 2010-265436 or the like in detail and contains, for example, a polydimethylsiloxane containing silanol groups at both ends, a vinyltrimethoxysilane, a (3-glycidoxypropyl)trimethoxysilane, a dimethylpolysiloxane-co-methylhydrogenpolysiloxane, a tetramethylammonium hydroxide, and a platinum-carbonyl complex. To be specific, in order to prepare the second condensation reaction and addition reaction curable type silicone resin, for example, first, an ethylenically unsaturated hydrocarbon group-containing silicon compound and an ethylenically unsaturated hydrocarbon group-containing silicon compound, which are a condensation material, and a condensation catalyst are simultaneously added; next, an organohydrogenpolysiloxane, which is an addition material, is added thereto; and thereafter, a hydrosilylation catalyst (an addition catalyst) is added thereto.

The content ratio (the concentration) of the transition metal of the catalyst with respect to the silicone resin composition is, on the mass basis, 0.1 ppm or more, preferably 0.15 ppm or more, more preferably 0.2 ppm or more, or further more preferably 0.3 ppm or more, and is, for example, 500 ppm or less, preferably 50 ppm or less, or more preferably 10 ppm or less.

The embedding layer 2 is formed from a silicone resin composition before a thermosetting silicone resin (to be specific, a two-step curable type silicone resin) is completely cured (is brought into a C-stage state), to be more specific, a silicone resin composition in a B-stage state.

A fabrication method of the embedding layer 2 is described later in detail.

A concentration C2 of the transition metal in the embedding layer 2 is, on the mass basis, for example, 0.1 ppm or more, preferably 0.2 ppm or more, or more preferably 0.25 ppm or more, and is, for example, 100 ppm or less, preferably 10 ppm or less, or more preferably 7 ppm or less.

When the concentration C2 of the transition metal in the embedding layer 2 is not less than the above-described lower limit, a reaction of the silicone resin is accelerated and the silicone resin can be cured within a desired duration (for example, 60 minutes or less), so that the productivity of an LED device 10 (ref: FIG. 2 (b)) can be improved. On the other hand, when the concentration C2 of the transition metal in the embedding layer 2 is not more than the above-described upper limit, an increase in the reaction rate of the silicone resin is suppressed and the encapsulating properties with respect to the wire 7 can be improved without thickening a thickness L2 (described later) of the embedding layer 2.

The concentration C2 of the transition metal in the embedding layer 2 is a concentration of the transition metal of the embedding layer 2 before a cured region 9 (described later, ref: dash-dot lines in FIGS. 1 and 2) is formed in the embedding layer 2 caused by the transition of the transition metal from the cover layer 3 to the embedding layer 2, to be specific, a concentration of the transition metal of the embedding layer 2 immediately after the fabrication (within 24 hours since the fabrication). In other words, the concentration C2 of the transition metal in the embedding layer 2 is substantially the same as the concentration C2 of the transition metal in the silicone resin composition (a silicone resin composition for an embedding layer) for forming the embedding layer 2. The concentration C2 of the transition metal in the silicone resin composition for an embedding layer is measured by, for example, an ICP analysis. The concentration C2 is also obtained as a calculated value that is calculated from a charged amount of the components.

A ratio R (=C1/C2) of the concentration C1 of the transition metal in the cover layer 3 to the concentration C2 of the transition metal in the embedding layer 2 is 1 or more, preferably 2 or more, more preferably 3 or more, further more preferably 4 or more, particularly preferably 10 or more, or most preferably 20 or more, and is, for example, 100 or less, or preferably 50 or less.

When the ratio R is below the above-described lower limit, that is, when the concentration C1 of the transition metal in the cover layer 3 is lower than the concentration C2 of the transition metal in the embedding layer 2, it is impossible that the embedding layer 2 is prepared from a silicone resin composition before complete curing and the cover layer 3 is prepared from a silicone resin composition after complete curing.

That is, for example, when the embedding layer 2 is prepared from a silicone resin composition before complete curing, the cover layer 3 contains the transition metal with the concentration C1 that is lower than the concentration C2 of the transition metal in the embedding layer 2, so that the cover layer 3 has an amount of catalyst that is below the amount of catalyst required for the complete curing, that is, in the cover layer 3, the catalyst is insufficient. Thus, the cover layer 3 is not completely cured, that is, the cover layer 3 is obtained from the silicone resin composition before complete curing. As a result, the cover layer 3 is excessively softened, to be specific, the compressive elastic modulus thereof is below the above-described lower limit, so that the handling ability of the encapsulating sheet 1 is significantly reduced.

On the other hand, when the cover layer 3 is prepared from a silicone resin composition after complete curing, the embedding layer 2 contains the transition metal with the concentration C2 that is higher than the concentration C1 of the transition metal in the cover layer 3, so that the embedding layer 2 has an amount of catalyst that is above the amount of catalyst required for the complete curing, that is, in the embedding layer 2, the catalyst is excessive. Thus, in the embedding layer 2, a curing reaction of the silicone resin composition is accelerated without interruption, so that the silicone resin composition is completely cured, that is, the embedding layer 2 is obtained from the silicone resin composition after complete curing. As a result, the embedding layer 2 is excessively hardened, to be specific, the elastic modulus of the embedding layer 2 to be described later is above the above-described upper limit, so that when the wire 7 is covered with the embedding layer 2, the wire 7 is damaged.

The embedding layer 2 immediately after the fabrication has an elastic modulus at 25° C. of, for example, 40 kPa or more, or preferably 60 kPa or more, and of, for example, 500 kPa or less, or preferably 300 kPa or less. The elastic modulus is measured using a nanoindenter. The measurement conditions of the elastic modulus are described in detail in Examples to be described later.

The thickness L2 of the embedding layer 2, that is, the length L2 from the top surface of the embedding layer 2 to the back surface thereof, that is, the length L2 from the interface 4 between the embedding layer 2 and the cover layer 3 to the top-most surface of the encapsulating sheet 1 is, for example, 100 μm or more, preferably 300 μm or more, or more preferably 500 μm or more, and is, for example, 2000 μm or less, preferably 1700 μm or less, or more preferably 1500 μm or less. When the thickness L2 of the embedding layer 2 is not less than the above-described lower limit, a reduction in the handling ability of the encapsulating sheet 1 can be effectively prevented. When the thickness L2 of the embedding layer 2 is not more than the above-described upper limit, an increase in the production cost can be effectively suppressed.

The release sheet 8 is a substrate that supports the cover layer 3. The release sheet 8 is not particularly limited as long as it has durability with respect to heating at the time of forming the embedding layer 2 and the cover layer 3, that is, heat resistance. Examples thereof include a polymer sheet such as a polyethylene sheet, a polyester sheet (PET or the like), a polystyrene sheet, a polycarbonate sheet, and a polyimide sheet; a ceramic sheet; and a metal foil. Preferably, a polymer sheet is used, or more preferably, a PET sheet is used. A release treatment such as a fluorine treatment can be applied to the surface of the release sheet 8. The thickness of the release sheet 8 is, for example, 20 μm or more, or preferably 50 μm or more, and is, for example, 200 μm or less, or preferably 150 μm or less. When the thickness of the release sheet 8 is not less than the above-described lower limit, a reduction in the handling ability of the encapsulating sheet 1 can be effectively prevented. When the thickness of release sheet 8 is not more than the above-described upper limit, an increase in the production cost can be effectively suppressed.

Next, a method for producing the encapsulating sheet 1 is described.

In this method, first, the cover layer 3 is laminated on the surface of the release sheet 8 in a sheet shape.

In order to laminate the cover layer 3 on the surface of the release sheet 8, the silicone resin composition (the silicone resin composition for a cover layer) containing the above-described components is prepared as a varnish.

In the preparation of the varnish, the catalyst is prepared as a solution obtained by being dissolved by a solvent as required. To be specific, examples of the solvent include an aliphatic hydrocarbon such as hexane, an aromatic hydrocarbon such as xylene, and a siloxane such as a vinylmethyl cyclic siloxane (a cyclic methylvinylsiloxane) and a polydimethylsiloxane containing vinyl groups at both ends. The solvent is blended so that the content ratio of the catalyst in the solution is, for example, 0.1 mass % or more, or preferably 1 mass % or more, and is, for example, 10 mass % or less, or preferably 5 mass % or less. A commercially available product can be used as the solution. An example of the commercially available product thereof includes the SIP series. To be specific, examples thereof include "SIP 6829.2" (trade name, manufactured by Gelest, Inc.) that is a vinylmethyl cyclic siloxane solution with a concentration of 2.0 mass % of a platinum-carbonylcyclovinylmethylsiloxane complex and "SIP 6832.2" (trade name, manufactured by Gelest, Inc.) that is a cyclic methylvinylsiloxane solution with a concentration of 2 to 2.5 mass % of a platinum-cyclovinylmethylsiloxane complex.

Thereafter, the silicone resin composition is applied to the surface of the release sheet 8 with, for example, an applicator to fabricate a film. Thereafter, when the catalyst is prepared as a solution, the obtained product is heated as required and the solvent is removed.

The heating conditions are as follows: a heating temperature of, for example, 80° C. or more, or preferably 100° C. or more, and of, for example, 200° C. or less, or preferably 180° C. or less and a heating duration of, for example, 1 minute or more, or preferably 5 minutes or more, and of, for example, 60 minutes or less, or preferably 15 minutes or less. When the silicone resin is formed from a thermosetting silicone resin (to be specific, a one-step curable type silicone resin), the film is completely cured (is brought into a C-stage state), so that the cover layer 3 after complete curing (a C-stage state) is formed. Furthermore, when the catalyst is a hydrosilylation catalyst, a hydrosilylation addition reaction (a hydrosilylation reaction) of the thermosetting silicone resin (to be specific, the one-step curable type silicone resin) is accelerated by the above-described heating, so that the film is completely cured.

Next, the embedding layer 2 is laminated on the surface of the cover layer 3.

In order to laminate the embedding layer 2 on the surface of the cover layer 3, the silicone resin composition (the silicone resin composition for an embedding layer) containing the above-described components is prepared as a varnish. Thereafter, the silicone resin composition is applied to the surface of the cover layer 3 with, for example, an applicator to fabricate a film. Thereafter, when the catalyst is prepared as a solution, the obtained product is heated as required and the solvent is removed.

The heating conditions are as follows: a heating temperature of, for example, 40° C. or more, or preferably 80° C. or more, and of, for example, 200° C. or less, or preferably 150° C. or less and a heating duration of, for example, 1 minute or more, or preferably 5 minutes or more, and of, for example, 24 hours or less, or preferably 1 hour or less.

When the silicone resin is formed from a thermosetting silicone resin (to be specific, a two-step curable type silicone resin), the film is not completely cured (is not brought into a C-stage state), while being semi-cured (being brought into a B-stage state), that is, the embedding layer 2 before complete curing (in a C-stage state) is formed.

In this way, the encapsulating sheet 1 in which the embedding layer 2 that is formed from the silicone resin composition after complete curing and the cover layer 3 that is formed from the silicone resin composition before complete curing are sequentially laminated on the surface of the release sheet 8 is obtained.

In the fabrication of a laminate sheet of the embedding layer 2 and the cover layer 3, in addition to the above-described fabrication method by using a laminate film, a method in which the embedding layer 2 and the cover layer 3 are separately formed into a film in advance to be then attached to each other is also used. In the fabrication by the attachment, the heating conditions or the like of the embedding layer 2 and the cover layer 3 can be in conformity with the above-described description.

Thereafter, as shown by a phantom line in FIG. 1, a protective sheet 11 can be provided on the surface of the embedding layer 2 so as to protect the obtained encapsulating sheet 1 as required.

The protective sheet 11 can be formed from the same material as that of the release sheet 8 and is formed into the same size as that of the release sheet 8.

Next, a method for producing the LED device 10 by the encapsulating sheet 1 is described with reference to FIG. 2.

In this method, as shown in FIG. 2 (a), as an optical semiconductor element, the LED 6 that is mounted on the board 5 by a wire-bonding connection is prepared.

The board 5 is made of an insulating board such as a laminate board in which an insulating layer is laminated on a silicone board, a ceramic board, a polyimide resin board, or a metal board.

On the surface of the board 5, a conductive pattern (not shown) including an electrode (that is, a board-side terminal, not shown) for being electrically connected to a terminal (not shown) of the LED 6 to be described next and a wire that is continuous thereto is formed. The conductive pattern is formed of a conductor such as gold, copper, silver, or nickel.

The LED 6 is an optical semiconductor element that converts electrical energy into light energy. The LED 6 is, for example, formed into a generally rectangular shape in sectional view having the thickness shorter than the length in the plane direction (the length in the right-left direction). The surface of the LED 6 is formed of a terminal that is not shown and the terminal is electrically connected to an electrode (not shown), which is provided at spaced intervals to the disposed position of the LED 6 on the surface of the board 5 in the right-left direction, via the wire 7, so that the LED 6 is mounted on the board 5. An example of the LED 6 includes a blue LED (a light emitting diode element) that emits blue light. A thickness L3 of the LED 6 is, for example, 10 to 1000 µm.

The wire 7 is formed into a linear shape. One end of the wire 7 is electrically connected to the terminal of the LED 6 and the other end thereof is electrically connected to the electrode (not shown) of the board 5.

An example of a material of the wire 7 includes a metal material that is used as a wire-bonding material of the LED 6 such as gold, silver, or copper. Preferably, in view of corrosion resistance, gold is used.

The wire diameter (the thickness) of the wire 7 is, for example, 10 µm or more, or preferably 20 µm or more, and is, for example, 100 µm or less, or preferably 50 µm or less.

The wire 7 is curved or bended in a state where the wire 7 connects the LED 6 to the board 5 and is formed into a generally arc shape (for example, a triangular arc shape, a quadrangular arc shape, or a circular arc shape).

In the wire 7, a length L4 from one end (the surface of the terminal of the LED 6) thereof to a portion that is positioned at the upper-most side (that is, the top-most portion) (to be specific, the side of the embedding layer 2 to be described later) is, for example 100 µm or more, or preferably 150 µm or more, and is, for example, 2000 µm or less, or preferably 1000 µm or less.

In the wire 7, a length (that is, a height of the wire 7) L5 from the other end (the surface of the electrode of the board 5) thereof to the top-most portion is, for example 100 µm or more, or preferably 300 µm or more, and is, for example, 1000 µm or less, or preferably 500 µm or less. The height L5 of the wire 7 with respect to the thickness L3 of the LED 6 is, for example, one and a half times or more, or preferably twice or more, and is, for example, ten times or less, or preferably five time or less. When the height L5 of the wire 7 is not less than the above-described lower limit, a reduction in accuracy of the wire-bonding can be effectively prevented. When the height L5 of the wire 7 is not more than the above-described upper limit, a deformation of the wire 7 can be effectively suppressed.

A length D in the right-left direction between both ends of the wire 7 is, for example, 0.1 mm or more, or preferably 0.3 mm or more, and is, for example, 3 mm or less, or preferably 2 mm or less. When the length D in the right-left direction between both ends of the wire 7 is not less than the above-described lower limit, a reduction in accuracy of the wire-bonding can be effectively prevented. When the length D in the right-left direction between both ends of the wire 7 is not more than the above-described upper limit, a deformation of the wire 7 can be effectively suppressed.

Next, the encapsulating sheet 1 shown in FIG. 1 is reversed upside down and the resulting encapsulating sheet 1 is disposed in opposed relation to the upper side of the LED 6. That is, the encapsulating sheet 1 is disposed so that the embedding layer 2 faces the LED 6. When the protective sheet 11 is provided, the protective sheet 11 is peeled from the embedding layer 2 in advance.

Subsequently, as shown by arrows in FIG. 2 (a), and FIG. 2 (b), the LED 6 is embedded by the encapsulating sheet 1 (an embedding step).

To be specific, the encapsulating sheet 1 is lowered (is pushed down) by the embedding step and the LED 6 and the wire 7 are covered with the embedding layer 2. That is, the LED 6 and the wire 7 are embedded in the embedding layer 2.

In the embedding step, the LED 6 and the wire 7 are, when projected in the plane direction, not overlapped with the cover layer 3 and embedded in the embedding layer 2 only. That is, the cover layer 3 is positioned at spaced intervals to the upper side of the LED 6 and the wire 7 (at least the top-most portion of the wire 7).

A length L6 from the interface 4 between the embedding layer 2 and the cover layer 3 to the top-most portion of the wire 7 is 150 µm or more. In other words, the interface 4 between the embedding layer 2 and the cover layer 3 is positioned at a higher position by 150 µm or more than the top-most portion of the wire 7.

The above-described length L6 is set to be, for example, 2000 µm or less, or preferably 1500 µm or less.

When the length L6 is below the above-described lower limit, there is a disadvantage that a formation region of the cured region 9 to be described later and the wire 7 (to be specific, at least the top-most portion of the wire 7) are overlapped with each other, so that the wire 7 is damaged. On the other hand, when the length L6 is not more than the above-described upper limit, an increase in the production cost of the encapsulating sheet 1 can be effectively suppressed.

Thereafter, the encapsulating sheet 1 is heated as required. Preferably, the encapsulating sheet 1 is hot-pressed with respect to the board 5.

By the heating of the encapsulating sheet 1, the cover layer 3 is completely cured (is brought into a C-stage state).

In this way, the LED device 10 including the encapsulating sheet 1, the LED 6 that is encapsulated by the embedding layer 2 covered with the cover layer 3 of the encapsulating sheet 1, and the board 5 that is mounted with the LED 6 is obtained.

Thereafter, as shown by the phantom line in FIG. 2 (b), the protective sheet 11 is peeled from the cover layer 3 as required.

When the LED 6 is embedded by the above-described encapsulating sheet 1, the length L6 from the interface 4 between the embedding layer 2 and the cover layer 3 to the top-most portion of the wire 7 that is positioned closest to the side of the cover layer 3 is ensured to be 150 μm or more. And, a reaction of the silicone resin composition is accelerated and the curing is progressed, so that the cured region 9, which is shown by the dash-dot lines in FIGS. 1 and 2, is formed in the side of the cover layer 3 of the embedding layer 2 by the transition of the catalyst from the cover layer 3 to the embedding layer 2 caused by the ratio R of the concentration C1 of the transition metal in the cover layer 3 to the concentration C2 of the transition metal in the embedding layer 2 of 1 or more. Even so, a thickness L7 of the cured region 9 has a thickness of less than 150 μm from the interface 4 between the embedding layer 2 and the cover layer 3, so that overlapping of the cured region 9 in the embedding layer 2 with the wire 7 can be prevented and a damage such as a deformation of the wire 7 caused by the overlapping of the cured region 9 with the wire 7 can be effectively prevented.

The encapsulating sheet 1 includes the embedding layer 2 and the cover layer 3 in advance, so that the LED 6 and the wire 7 can be collectively embedded by and covered with the embedding layer 2 and the cover layer 3. Thus, the LED 6 and the wire 7 can be easily embedded and encapsulated with less number of steps.

In the encapsulating sheet 1, when the cover layer 3 is formed from a silicone resin composition after complete curing, it has excellent handling ability. Also, a damage to the wire 7 can be effectively prevented and the wire 7 can be embedded and encapsulated by the embedding layer 2 that is formed from a silicone resin composition before complete curing.

In the encapsulating sheet 1, when the catalyst is a hydrosilylation catalyst, the curing of the silicone resin composition can be surely accelerated.

In the encapsulating sheet 1, when the silicone resin composition of the embedding layer 2 and/or the cover layer 3 contains a phosphor, the wavelength of light emitted from the LED 6 is converted by the embedding layer 2 and/or the cover layer 3, so that the conversion efficiency of the light can be increased.

In the above-described LED device 10, a damage to the wire 7 is effectively prevented and thus, the LED device 10 has excellent reliability.

In the embodiment in FIG. 2, one LED 6 is mounted on the board 5. Alternatively, for example, though not shown, a plurality of the LEDs 6 are mounted on the board 5 and a plurality of the embedding layers 2 and a plurality of the wires 7 corresponding thereto can be covered with one piece of the encapsulating sheet 1.

In the embodiment in FIG. 2, the LED 6 and the LED device 10 are described as one example of the optical semiconductor element and the optical semiconductor device of the present invention, respectively. Alternatively, for example, an LD (laser diode) 6 and a laser diode device 10 can be also replaced with an optical semiconductor element and an optical semiconductor device, respectively.

EXAMPLES

1. Production Example A of Cover Layer

Production Examples 1A and 4A and Comparative Production Examples 1A to 3A 60 g of fumed silica (SIS 6962.0, a hexamethylenesilazane processed product, a sphere shape, an average particle size of 20 nm, manufactured by Gelest, Inc.) was added to 140 g of a polydimethylsiloxane containing vinyl groups at both ends (DMS-V31, manufactured by Gelest, Inc.) to be stirred. Subsequently, 5.6 g of a methylhydrosiloxane-dimethylsiloxane copolymer blocked with trimethylsilyl groups at both ends (HMS-301, manufactured by Gelest, Inc.) was added thereto to be further stirred, so that a mixture A of a silicone resin for a cover layer was fabricated. In the following, the mixture A was used for Production Examples A and Comparative Production Examples A.

Thereafter, 0.56 μL (a platinum content: 0.011 mg) of a vinylmethyl cyclic siloxane solution with a concentration of 2.0 mass % of a platinum-carbonylcyclovinylmethylsiloxane complex (SIP 6829.2, manufactured by Gelest, Inc.) was added to 30 g of the mixture A to be further stirred, so that a varnish of the silicone resin composition for a cover layer was prepared.

The platinum content in the platinum-carbonylcyclovinylmethylsiloxane complex was determined by an ICP-MS. To be specific, first, the platinum-carbonylcyclovinylmethylsiloxane complex was dissolved by a mixture (mixed acids) of a nitric acid and a hydrofluoric acid to prepare a sample for measurement. Next, the platinum content of the prepared sample for measurement was determined using an ICP-MS device (part number: 7500 cs, manufactured by Agilent Technologies, Inc.).

Thereafter, the varnish of the silicone resin composition for a cover layer was applied onto the surface of a release sheet made of a PET with an applicator so that a thickness L1 after drying was 400 μm. Next, the obtained product was heated in an oven at 105° C. for 10 minutes to be cured, so that a cover layer in a C-stage state (after complete curing) was fabricated.

The concentration of the platinum in the cover layer was, on the mass basis, 0.38 ppm as a calculated value that was calculated from a charged amount of the components.

Production Examples 2A and 3A 0.48 μL (a platinum content: 0.011 mg) of a cyclic methylvinylsiloxane solution with a concentration of 2 to 2.5 mass % of a platinum-cyclovinylmethylsiloxane complex (SIP 6832.2, manufactured by Gelest, Inc.) was added to 30 g of the mixture A to be further stirred, so that a varnish of the silicone resin composition for a cover layer was prepared.

Thereafter, the varnish of the silicone resin composition for a cover layer was applied onto the surface of a release sheet made of a PET with an applicator so that a thickness L1 after drying was 400 μm. Next, the obtained product was heated in an oven at 105° C. for 10 minutes to be cured, so that a cover layer in a C-stage state (after complete curing) was fabricated.

The concentration of the platinum in the cover layer was, on the mass basis, 0.38 ppm as a calculated value that was calculated from a charged amount of the components.

Production Example 5A

A cover layer was fabricated in the same manner as in Production Example 1A, except that the mixed amount of the vinylmethyl cyclic siloxane solution with a concentration of 2.0 mass % of a platinum-carbonylcyclovinylmethylsiloxane complex (SIP 6829.2, manufactured by Gelest, Inc.) was changed from 0.56 μL (a platinum content: 0.011 mg) to 1.13 μL (a platinum content: 0.022 mg).

The concentration of the platinum in the cover layer was, on the mass basis, 0.76 ppm as a calculated value that was calculated from a charged amount of the components.

Production Example 6A

A cover layer was fabricated in the same manner as in Production Example 1A, except that the mixed amount of the vinylmethyl cyclic siloxane solution with a concentration of 2.0 mass % of a platinum-carbonylcyclovinylmethylsiloxane complex (SIP 6829.2, manufactured by Gelest, Inc.) was changed from 0.56 μL (a platinum content: 0.011 mg) to 2.25 μL (a platinum content: 0.045 mg).

The concentration of the platinum in the cover layer was, on the mass basis, 1.52 ppm as a calculated value that was calculated from a charged amount of the components.

Production Example 7A 20 g of silicone rubber particles (an average particle size of 7 μm) were added to 80 g of a silicone elastomer (ERASTO-SIL LR7665, containing a platinum-based catalyst, manufactured by Wacker Asahikasei Silicone Co., Ltd.) to be stirred, so that a silicone resin composition was prepared. The prepared silicone resin composition was applied onto the surface of a release sheet made of a PET with an applicator so that a thickness L1 after heating was 400 μm. Next, the obtained product was heated in an oven at 105° C. for 10 minutes to be cured, so that a cover layer in a C-stage state (after complete curing) was fabricated.

The concentration of the platinum in the cover layer was, on the mass basis, 8.25 ppm by an ICP analysis.

Production Example 8A

A cover layer was fabricated in the same manner as in Production Example 1A, except that the mixed amount of the vinylmethyl cyclic siloxane solution with a concentration of 2.0 mass % of a platinum-carbonylcyclovinylmethylsiloxane complex (SIP 6829.2, manufactured by Gelest, Inc.) was changed from 0.56 μL (a platinum content: 0.011 mg) to 1.88 μL (a platinum content: 0.038 mg).

The concentration of the platinum in the cover layer was, on the mass basis, 1.25 ppm as a calculated value that was calculated from a charged amount of the components.

Production Example 9A

A cover layer was fabricated in the same manner as in Production Example 1A, except that the mixed amount of the vinylmethyl cyclic siloxane solution with a concentration of 2.0 mass % of a platinum-carbonylcyclovinylmethylsiloxane complex (SIP 6829.2, manufactured by Gelest, Inc.) was changed from 0.56 μL (a platinum content: 0.011 mg) to 9.0 μL (a platinum content: 0.018 mg).

The concentration of the platinum in the cover layer was, on the mass basis, 6.0 ppm as a calculated value that was calculated from a charged amount of the components.

2. Production Example B of Embedding Layer and Encapsulating Sheet

Production Examples 1B, 3B, and 5B to 7B

With respect to 2031 g (0.177 mol) of a polydimethylsiloxane containing silanol groups at both ends [a compound in which in the following formula (1), all of $R^1$s are methyl groups and n=155, an average molecular weight of 11,500], which was heated at 40° C., 15.76 g (0.106 mol) of a vinyltrimethoxysilane [a compound in which in the following formula (2), $R^2$ is a vinyl group and all of $X^1$s are methoxy groups], as an ethylenically unsaturated hydrocarbon group-containing silicon compound, and 2.80 g (0.0118 mol) [the ratio (SIOH/(SiX$^1$+SiX$^2$)=1/1) of the number of moles of the SiOH group in the polydimethylsiloxane containing silanol groups at both ends to the total number of moles of the SiX$^1$ group in the ethylenically unsaturated hydrocarbon group-containing silicon compound and the SiX$^2$ group in the ethylenically unsaturated hydrocarbon group-containing silicon compound] of a (3-glycidoxypropyl)trimethoxysilane [a compound in which in the following formula (3), $R^3$ is a 3-glycidoxypropyl group and all of $X^2$s are methoxy groups], as an ethylenically unsaturated hydrocarbon group-containing silicon compound, were stirred and mixed. Thereafter, 0.97 mL (an amount of catalyst: 0.88 mol, 0.50 mol with respect to 100 mol of a polydimethylsiloxane containing silanol groups at both ends) of a methanol solution of a tetramethylammonium hydroxide (a concentration of 10 mass %), as a condensation catalyst, was added to the obtained mixture to be stirred at 40° C. for one hour. The obtained oil was stirred at 40° C. for one hour and a pressure thereof was reduced (10 mmHg), so that a volatile component was removed. Next, the pressure in the reaction liquid wad brought back to a normal pressure and thereafter, an organohydrogenpolysiloxane (a dimethylpolysiloxane-co-methylhydrogenpolysiloxane) was added thereto so that the molar ratio of the alkenyl group to the hydrosilyl group was SiR$^2$/SiH=1/3.0 to be stirred at 40° C. for one hour. Thereafter, 0.038 mL (0.375 ppm of the platinum content with respect to the organopolysiloxane) of a platinum-carbonyl complex (a concentration of platinum of 2.0 mass %), as a hydrosilylation catalyst, was added thereto to be stirred at 40° C. for 10 minutes, so that a silicone resin composition B for an embedding layer was fabricated.

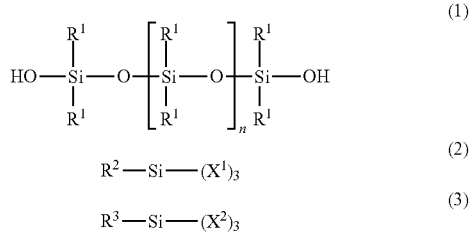

20 mass % of silicone rubber particles (an average particle size of 7 μm) and 10 mass % of YAG particles (an average particle size of 7 μm), which was a yellow phosphor, were added to the fabricated silicone resin composition B for an embedding layer. The silicone resin composition B for an embedding layer to which the silicone rubber particles and the YAG particles were added was laminated on the surface of the cover layer so that a thickness L2 after heating was 600 μm. Then, the obtained laminate was cured in an oven at 135° C. for 10 to 20 minutes, so that an embedding layer in a B-stage state was formed.

The concentration of the platinum in the embedding layer was, on the mass basis, 0.26 ppm as a calculated value that was calculated from a charged amount of the components. The elastic modulus at 25° C. of the embedding layer measured using a nanoindenter was 70 kPa. To be specific, the elastic modulus was calculated by compressing the embedding layer with a Berkovich terminal (indenter). The elastic modulus of the following Production Examples was calculated in the same manner as that described above.

In this way, an encapsulating sheet including the cover layer and the embedding layer and having the total thickness (L1+L2) of 1000 μm was obtained.

Production Example 2B

An embedding layer in a B-stage state was formed and subsequently, an encapsulating sheet was obtained in the same manner as in Production Example 1B, except that, as a hydrosilylation catalyst, 0.038 mL (0.375 ppm of the platinum content with respect to the organopolysiloxane) of a platinum-vinylsiloxane complex (a concentration of platinum of 2.0 mass %) was used instead of 0.038 mL (0.375 ppm of the platinum content with respect to the organopolysiloxane) of a platinum-carbonyl complex (a concentration of platinum of 2.0 mass %).

The concentration of the platinum in the embedding layer was, on the mass basis, 0.26 ppm as a calculated value that was calculated from a charged amount of the components. The elastic modulus at 25° C. of the embedding layer measured using a nanoindenter was 70 kPa.

Production Example 4B

An embedding layer in a B-stage state was formed and subsequently, an encapsulating sheet having a total thickness of 900 μm was obtained in the same manner as in Production Example 1B, except that the thickness L2 of the embedding layer after heating was changed to 500 μm.

The elastic modulus at 25° C. of the embedding layer measured using a nanoindenter was 70 kPa.

Production Example 8B

An embedding layer in a B-stage state was formed and subsequently, an encapsulating sheet was obtained in the same manner as in Production Example 1B, except that the mixed amount of the platinum-carbonyl complex (a concentration of platinum of 2.0 mass %) was changed from 0.038 mL (0.375 ppm of the platinum content with respect to the organopolysiloxane) to 0.19 mL (1.79 ppm of the platinum content with respect to the organopolysiloxane).

The concentration of the platinum in the embedding layer was, on the mass basis, 1.25 ppm as a calculated value that was calculated from a charged amount of the components. The elastic modulus at 25° C. of the embedding layer measured using a nanoindenter was 70 kPa.

Production Example 9B

An embedding layer in a B-stage state was formed and subsequently, an encapsulating sheet was obtained in the same manner as in Production Example 1B, except that the mixed amount of the platinum-carbonyl complex (a concentration of platinum of 2.0 mass %) was changed from 0.038 mL (0.375 ppm of the platinum content with respect to the organopolysiloxane) to 0.87 mL (8.6 ppm of the platinum content with respect to the organopolysiloxane).

The concentration of the platinum in the embedding layer was, on the mass basis, 6.0 ppm as a calculated value that was calculated from a charged amount of the components. The elastic modulus at 25° C. of the embedding layer measured using a nanoindenter was 70 kPa.

Comparative Production Example 1B

An embedding layer in a B-stage state was formed and subsequently, an encapsulating sheet having a total thickness of 950 μm was obtained in the same manner as in Production Example 1B, except that the thickness L2 of the embedding layer after heating was changed to 550 μm.

The elastic modulus at 25° C. of the embedding layer measured using a nanoindenter was 70 kPa.

Comparative Production Example 2B

An embedding layer in a B-stage state was formed and subsequently, an encapsulating sheet having a total thickness of 850 μm was obtained in the same manner as in Production Example 1B, except that the thickness L2 of the embedding layer after heating was changed to 450 μm.

The elastic modulus at 25° C. of the embedding layer measured using a nanoindenter was 70 kPa.

Comparative Production Example 3B

An embedding layer in a B-stage state was formed and subsequently, an encapsulating sheet having a total thickness of 800 μm was obtained in the same manner as in Production Example 1B, except that the thickness L2 of the embedding layer after heating was changed to 400 μm.

The elastic modulus at 25° C. of the embedding layer measured using a nanoindenter was 70 kPa.

3. Covering of LED and Wire 3-1. <Embedding of LED and Wire by Encapsulating Sheet Immediately after Fabrication>

[Height L4 of the wire: 450 μm]

Examples 1 to 3 and 5 to 9 and Comparative Examples 1 and 3

An LED in a generally rectangular shape in plane view that was mounted on a board by a wire-bonding connection was prepared (ref: FIG. 2 (a)). The size of the LED and a wire was shown in the following.

Thickness L3 of the LED: 150 μm

Wire diameter of the wire: 30 μm

Height L4 of the wire: 450 μm

Length D in the right-left direction between both ends of the wire: 2000 μm

Subsequently, an embedding step was performed by each of the encapsulating sheets in Production Examples 1B to 3B and 5B to 9B and Comparative Production Examples 1B and 3B immediately after the fabrication. In the embedding step, the encapsulating sheet was disposed at the upper side of the board and subsequently, the encapsulating sheet was pushed down to cover and embed the LED and the wire by an embedding layer. In this way, each of the resulting products was defined as Examples 1 to 3 and 5 to 9 and Comparative Examples 1 and 3.

As a result, the size relation of an interface between the embedding layer and the cover layer with the wire was shown in the following.

Length L6 from the interface between the embedding layer and the cover layer to the top-most portion of the wire: 150 μm (Examples 1 to 3 and 5 to 9)

Length L6 from the interface between the embedding layer and the cover layer to the top-most portion of the wire: 100 μm (Comparative Example 1)

In Examples 1 to 3 and 5 to 9 and Comparative Example 1, a deformation of the wire was not observed.

On the other hand, in Comparative Example 3, the top-most portion of the wire was deformed due to contact with the cover layer.

3-2. <Covering of LED and Wire by Encapsulating Sheet after being Stored at 5° C. for One Month Since Fabrication>

[Height L4 of the wire: 450 μm]

Examples 1 to 3 and 5 to 9 and Comparative Examples 1 and 3

(Height L4 of the wire: 450 μm)

The procedure was processed in the same manner as that in the above-described 3-1, except that the encapsulating sheet after being stored at 5° C. for one month since the fabrication was used.

As a result, the size relation of the interface between the embedding layer and the cover layer with the wire was shown in the following.

Length L6 from the interface between the embedding layer and the cover layer to the top-most portion of the wire: 150 μm (Examples 1 to 3 and 5 to 9)

Length L6 from the interface between the embedding layer and the cover layer to the top-most portion of the wire: 100 μm (Comparative Example 1)

In Examples 1 to 3 and 5 to 9, the length L6 from the interface between the embedding layer and the cover layer to the top-most portion of the wire was 150 μm. A deformation of the wire was not observed.

On the other hand, in Comparative Examples 1 and 3, a deformation of the wire was observed.

3-3. <Covering of LED and Wire by Encapsulating Sheet Immediately after Fabrication>

[Height L4 of the wire: 350 μm]

Examples 4 and Comparative Example 2

The procedure was processed in the same manner as in Example 1 in the above-described 3-1, except that the encapsulating sheet in Production Example 4B and Comparative Production Example 2B was used instead of the encapsulating sheet in Production Example 1B and the length (the height of the wire) L4 from one end of the wire to the top-most portion thereof was changed from 450 μm to 350 μm.

As a result, the size relation of the interface between the embedding layer and the cover layer with the wire was shown in the following.

Length L6 from the interface between the embedding layer and the cover layer to the top-most portion of the wire: 150 μm (Example 4)

Length L6 from the interface between the embedding layer and the cover layer to the top-most portion of the wire: 100 μm (Comparative Example 2)

In Example 4, a deformation of the wire was not observed.

On the other hand, in Comparative Example 2, a deformation of the wire was observed.

3-4. <Covering of LED and Wire by Encapsulating Sheet after being Stored at 5° C. for One Month Since Fabrication>

[Height L4 of the wire: 350 μm]

Example 4 and Comparative Example 2

The procedure was processed in the same manner as in Example 1 in the above-described 3-2, except that the encapsulating sheet in Production Example 4B and Comparative Production Example 2B was used instead of the encapsulating sheet in Production Example 1B and the length (the height of the wire) L4 from one end of the wire to the top-most portion thereof was changed from 450 μm to 350 μm.

As a result, the size relation of the interface between the embedding layer and the cover layer with the wire was shown in the following.

Length L6 from the interface between the embedding layer and the cover layer to the top-most portion of the wire: 150 μm (Example 4)

Length L6 from the interface between the embedding layer and the cover layer to the top-most portion of the wire: 100 μm (Comparative Example 2)

In Example 4, a deformation of the wire was not observed.

On the other hand, in Comparative Example 2, a deformation of the wire was observed.

TABLE 1

Table 1

| | Cover Layer | | | | Embedding Layer | | |
|---|---|---|---|---|---|---|---|
| Ex.-Comp. Ex. | Production Ex. A-Comp. Production Ex. A | Silicone Resin (Composition) | Pt Concentration [ppm] | Type | Production Ex. B-Comp. Production Ex. B | Pt Concentration (vs Silicone Resin Composition) [ppm] Pt Concentration (vs Organopolysiloxane) [ppm] | Type |
| Ex. 1 | Production Ex. 1A | Gelest | 0.38 | Pt-CO1 | Production Ex. 1B | 0.26 0.375 | Pt-CO2 |
| Ex. 2 | Production Ex. 2A | Gelest | 0.38 | Pt-dvs1 | Production Ex. 2B | 0.26 0.375 | Pt-dvs2 |
| Ex. 3 | Production Ex. 3A | Gelest | 0.38 | Pt-dvs1 | Production Ex. 3B | 0.26 0.375 | Pt-CO2 |
| Ex. 4 | Production Ex. 4A | Gelest | 0.38 | Pt-CO1 | Production Ex. 4B | 0.26 0.375 | Pt-CO2 |
| Ex. 5 | Production Ex. 5A | Gelest | 0.76 | Pt-CO1 | Production Ex. 5B | 0.26 0.375 | Pt-CO2 |
| Ex. 6 | Production Ex. 6A | Gelest | 1.52 | Pt-CO1 | Production Ex. 6B | 0.26 0.375 | Pt-CO2 |
| Ex. 7 | Production Ex. 7A | LR7665 | 8.25 | (Pt) | Production Ex. 7B | 0.26 0.375 | Pt-CO2 |
| Ex. 8 | Production Ex. 8A | Gelest | 1.25 | Pt-CO1 | Production Ex. 8B | 1.25 1.79 | Pt-CO2 |
| Ex. 9 | Production Ex. 9A | Gelest | 6.00 | Pt-CO1 | Production Ex. 9B | 6.0 8.6 | Pt-CO2 |
| Comp. Ex. 1 | Comp. Production Ex. 1A | Gelest | 0.38 | Pt-CO1 | Comp. Production Ex. 1B | 0.26 0.375 | Pt-CO2 |
| Comp. Ex. 2 | Comp. Production Ex. 2A | Gelest | 0.38 | Pt-CO1 | Comp. Production Ex. 2B | 0.26 0.375 | Pt-CO2 |
| Comp. Ex. 3 | Comp. Production Ex. 3A | Gelest | 0.38 | Pt-CO1 | Comp. Production Ex. 3B | 0.26 0.375 | Pt-CO2 |

TABLE 1-continued

Table 1

| | Embedding Layer | | | | | Deformation of Wire | |
|---|---|---|---|---|---|---|---|
| ExComp. Ex. | Elastic Modulus of Embedding Layer (kPa) | Thickness L2 of Embedding Layer [μm] | Length L6 from Interface to Upper End Portion of Wire [μm] | Ratio R of Pt Amount Cover Layer/Embedding Layer (C1/C2) | Height L5 of Wire [μm] | Initial Time | After Storage at 5° C. for 1 Month |
| Ex. 1 | 70 | 600 | 150 | 1.44 | 450 | Absence | Absence |
| Ex. 2 | 70 | 600 | 150 | 1.44 | 450 | Absence | Absence |
| Ex. 3 | 70 | 600 | 150 | 1.44 | 450 | Absence | Absence |
| Ex. 4 | 70 | 500 | 150 | 1.44 | 350 | Absence | Absence |
| Ex. 5 | 70 | 600 | 150 | 2.92 | 450 | Absence | Absence |
| Ex. 6 | 70 | 600 | 150 | 5.85 | 450 | Absence | Absence |
| Ex. 7 | 70 | 600 | 150 | 31.7 | 450 | Absence | Absence |
| Ex. 8 | 70 | 600 | 150 | 1 | 450 | Absence | Absence |
| Ex. 9 | 70 | 600 | 150 | 1 | 450 | Absence | Absence |
| Comp. Ex. 1 | 70 | 550 | 100 | 1.44 | 450 | Absence | Presence |
| Comp. Ex. 2 | 70 | 450 | 100 | 1.44 | 350 | Absence | Presence |
| Comp. Ex. 3 | 70 | 400 | — | 1.44 | 450 | Presence | Presence |

The unit "ppm" of the concentration in Table is calculated on the basis of mass.

For the abbreviations shown in Table, the details are given in the following.

Pt—CO1: a platinum-carbonylcyclovinylmethylsiloxane complex

Pt-dvs1: a platinum-cyclovinylmethylsiloxane complex

Pt—CO2: a platinum-carbonyl complex

Pt-dvs2: a platinum-vinylsiloxane complex

Gelest: a polydimethylsiloxane containing vinyl groups at both ends (DMS-V31) and a methylhydrosiloxane-dimethylsiloxane copolymer blocked with trimethylsilyl groups at both ends (HMS-301)

LR7665: a silicone elastomer (ERASTOSIL LR7665)

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. An encapsulating sheet, for encapsulating an optical semiconductor element mounted on a board by a wire-bonding connection, comprising:
    an embedding layer for embedding the optical semiconductor element and a wire and
    a cover layer covering the embedding layer, wherein
    the embedding layer and the cover layer contain a catalyst containing a transition metal and are prepared from a silicone resin composition that is cured by accelerating a reaction by the catalyst;
    the ratio of the concentration of the transition metal in the cover layer to that of the transition metal in the embedding layer is 1 or more; and
    the length from an interface between the embedding layer and the cover layer to the wire portion that is positioned closest to the cover layer-side is 150 μm or more.

2. The encapsulating sheet according to claim 1, wherein the cover layer is formed from a silicone resin composition after complete curing and
the embedding layer is formed from a silicone resin composition before complete curing.

3. The encapsulating sheet according to claim 1, wherein the catalyst is a hydrosilylation catalyst and
the transition metal is platinum.

4. The encapsulating sheet according to claim 1, wherein the silicone resin composition of the embedding layer and/or the cover layer contains a phosphor.

5. A method for producing an optical semiconductor device comprising the steps of:
    preparing an optical semiconductor element mounted on a board by a wire-bonding connection and embedding the optical semiconductor element by an encapsulating sheet, wherein
    the encapsulating sheet includes an embedding layer for embedding the optical semiconductor element and a wire and a cover layer covering the embedding layer, and
    the embedding layer and the cover layer contain a catalyst containing a transition metal and are prepared from a silicone resin composition that is cured by accelerating a reaction by the catalyst;
    the ratio of the concentration of the transition metal in the cover layer to that of the transition metal in the embedding layer is 1 or more; and
    the length from an interface between the embedding layer and the cover layer to a portion of the wire that is positioned closest to the cover layer-side is 150 μm or more.

6. An optical semiconductor device comprising:
    an optical semiconductor element mounted on a board by a wire-bonding connection and
    an encapsulating sheet that is an encapsulating sheet and encapsulates the optical semiconductor element, wherein
    the encapsulating sheet includes an embedding layer for embedding the optical semiconductor element and a wire and
    a cover layer covering the embedding layer, and
    the embedding layer and the cover layer contain a catalyst containing a transition metal and are prepared from a silicone resin composition that is cured by accelerating a reaction by the catalyst;
    the ratio of the concentration of the transition metal in the cover layer to that of the transition metal in the embedding layer is 1 or more; and the length from an interface between the embedding layer and the cover layer to a portion of the wire that is positioned closest to the cover layer-side is 150 μm or more.

7. An optical semiconductor device produced by a method for producing an optical semiconductor device comprising the steps of:

preparing an optical semiconductor element mounted on a board by a wire-bonding connection and embedding the optical semiconductor element by an encapsulating sheet, wherein the encapsulating sheet includes an embedding layer for embedding the optical semiconductor element and a wire and a cover layer covering the embedding layer, and the embedding layer and the cover layer contain a catalyst containing a transition metal and are prepared from a silicone resin composition that is cured by accelerating a reaction by the catalyst;

the ratio of the concentration of the transition metal in the cover layer to that of the transition metal in the embedding layer is 1 or more; and the length from an interface between the embedding layer and the cover layer to a portion of the wire that is positioned closest to the cover layer-side is 150 μm or more.

* * * * *